United States Patent [19]

Ginley et al.

[11] Patent Number: 5,358,928
[45] Date of Patent: Oct. 25, 1994

[54] HIGH TEMPERATURE SUPERCONDUCTOR STEP-EDGE JOSEPHSON JUNCTIONS USING TI-CA-BA-CU-O

[75] Inventors: David S. Ginley, Evergreen, Colo.; Vincent M. Hietala, Placitas, N. Mex.; Gert K. G. Hohenwarter, Madison, Wis.; Jon S. Martens, Sunnyvale, Calif.; Thomas A. Plut, Albuquerque, N. Mex.; Chris P. Tigges, Albuquerque, N. Mex.; Gregory A. Vawter, Albuquerque, N. Mex.; Thomas E. Zipperian, Albuquerque, N. Mex.

[73] Assignee: Sandia Corporation, Albuquerque, N. Mex.

[21] Appl. No.: 949,098

[22] Filed: Sep. 22, 1992

[51] Int. Cl.$^5$ .............. H01L 39/22; H01L 27/12; H01B 12/00
[52] U.S. Cl. .................. 525/192; 257/36; 257/39; 257/33; 505/702; 505/783; 505/832; 427/62
[58] Field of Search .............. 257/33, 34, 35, 31, 257/32, 39, 36, 662, 663; 427/62, 63; 505/1, 701, 702, 783, 832, 846

[56] References Cited

U.S. PATENT DOCUMENTS

| | | | |
|---|---|---|---|
| 4,430,662 | 2/1984 | Jillie, Jr. et al. | 257/662 |
| 5,026,682 | 6/1991 | Clark et al. | 505/1 |
| 5,077,266 | 12/1991 | Takagi et al. | 257/35 |
| 5,101,243 | 3/1992 | Chi et al. | 257/663 |
| 5,162,298 | 11/1992 | Chaudhari et al. | 257/33 |
| 5,198,413 | 3/1993 | Tarutani et al. | 257/35 |

FOREIGN PATENT DOCUMENTS 62-273782  11/1987  Japan ................. 257/34

OTHER PUBLICATIONS

Subramanyam et al, "Fabrication of Tl-Ca-Ba-Cu-O Superconducting Thin Films on LAAlO$_3$ Substrates," Appl. Phys. Lett., vol. 56, No. 18, 13 Apr. 1990, pp. 1799-1880.

K. P. Daly et al., "Substrate Step-Edge YBa$_2$Cu$_3$O$_7$ rf Squids", Appl. Phys. Lett., vol. 58, No. 5, Feb. 4, 1991, pp. 543-545.

K. Char et al., "Bi-Epitaxial Grain Boundary Junctions in YBa$_2$Cu$_3$O$_7$", Appl. Phys. Lett., vol. 59, No. 6, Aug. 5, 1991, pp. 733-735.

J. B. Barner et al., "All a-Axis Oriented YBa$_2$Cu$_3$O$_{7-y}$-PrBa$_2$Cu$_3$O$_{7-z}$-YBa$_2$Cu$_3$O$_{7-y}$ Josephson Devices Operating at 80 K", Appl. Phys. Lett., vol. 59, No. 6, Aug. 5, 1991, pp. 742-743.

D. S. Ginley et al., "Morphology Control and High Critical Currents in Superconducting Thin Films in the Tl-Ca-Ba-Cu-O Systems", Physica C 160, 1989, pp. 42-48.

(List continued on next page.)

Primary Examiner—Rolf Hille
Assistant Examiner—Mahshid Saadat
Attorney, Agent, or Firm—Gregory A. Cone

[57] ABSTRACT

A process for formulating non-hysteretic and hysteretic Josephson junctions using HTS materials which results in junctions having the ability to operate at high temperatures while maintaining high uniformity and quality. The non-hysteretic Josephson junction is formed by step-etching a LaAlO$_3$ crystal substrate and then depositing a thin film of TlCaBaCuO on the substrate, covering the step, and forming a grain boundary at the step and a subsequent Josephson junction. Once the non-hysteretic junction is formed the next step to form the hysteretic Josephson junction is to add capacitance to the system. In the current embodiment, this is accomplished by adding a thin dielectric layer, LaAlO$_3$, followed by a cap layer of a normal metal where the cap layer is formed by first depositing a thin layer of titanium (Ti) followed by a layer of gold (Au). The dielectric layer and the normal metal cap are patterned to the desired geometry.

5 Claims, 8 Drawing Sheets

OTHER PUBLICATIONS

J. S. Martens et al., "Fabrication of TlCaBaCuO Step-Edge Josephson Junctions With Hysteretic Behavior", *Appl. Phys. Lett.*, vol. 60, No. 8, Feb. 24, 1992, pp. 1013–1015.

J. S. Martens et al., "Tl-Ca-Ba-Cu-O Step-Edge Josephson Junctions", Appl. Phys. Lett., vol. 60, No. 9, Mar. 2, 1992, pp. 1141–1143.

S. Hasuo et al., "High-Speed Josephson Processor Technology", *IEEE Transactions on Magnetics* vol. 27, No. 2, Mar. 1991, pp. 2602–2609.

C. A. Mears et al., "Quantum Limited Quasiparticle Mixers at 100 GHz", *IEEE Transactions on Magnetics*, vol. 27, No. 2, Mar. 1991, pp. 3363–3369.

T. Van Duzer et al., *Principles of Superconductive Devices and Circuits*, Elsevier, New York, 1981, Chapters 2 and 5.

Q. Huang et al., "Ideal Tunneling Characteristics in $Ba_{1-x}K_xBiO_3$ Point-Contact Junctions With Au and Nb Tips", *Appl. Phys. Lett.*, vol. 57, No. 22, Nov. 26, 1990, pp. 2356–2358.

G. B. Donaldson, "Fabrication of Tunnel Junction Structures", *Superconducting Electronics*, NATO ASI Series, vol. F59, Springer-Verlag, Berlin, 1989, pp. 57–86.

D. Dimos et al., "Orientation Dependence of Grain-Boundary Critical Currents in $YBa_2Cu_3O_{7-\delta}$ Bicrystals", *Physical Review Letters*, vol. 61, No. 2, Jul. 11, 1988, pp. 219–222.

M. S. DiIorio et al., "Practical High $T_c$ Josephson Junctions and DC SQUIDs Operating Above 85 K", *Appl. Phys. Lett.*, vol. 58, No. 22, Jun. 3, 1991, pp. 2552–2554.

A. H. Miklich et al., "High-$T_c$ Thin-Film Magnetometer", *IEEE Transactions on Magnetics*, vol. 27, No. 2, Mar. 1991, pp. 3219–3222.

HIGH TEMPERATURE SUPERCONDUCTOR STEP-EDGE JOSEPHSON JUNCTIONS USING TI-CA-BA-CU-O

The Government has rights in this invention pursuant to Contract No. DE-AC04-75P00789 between the U.S. Department of Energy and American Telephone and Telegraph Company.

FIELD OF THE INVENTION

This invention relates generally to use of high temperature superconductors in the development of non-hysteretic and hysteretic Josephson junctions through the deposition of a Tl-Ca-Ba-Cu-O (Tl) film on a LaAlO$_3$ substrate to form the non-hysteretic junction and then through the implementation on this structure of a thin dielectric layer over the Tl film of the non-hysteretic junction followed by a normal metal cap layer to form the hysteretic junction. To formulate the non-hysteretic junction, a step is artificially etched into the substrate prior to application of the Tl film to induce a grain boundary junction in the Tl film covering the step in the substrate. The subsequent growth of the film over the step produces a Josephson junction having good uniformity and quality where the uniformity is judged by the dependence of the critical current, $I_c$, on the applied magnetic field, and the quality is measured in terms of the critical current density, $J_c$, and the product of the critical current, $I_c$, and the normal state resistance, $R_n$, i.e., $I_c R_n$. In addition, this invention permits the Josephson junction to operate at a high critical temperature, $T_c$.

Further processing of the non-hysteretic junction through the use of a multilayer technique produces an artificial capacitance capable of producing a TlCaBaCuO step-edge junction exhibiting large amounts of hysteresis at a temperature of 77K. Comparison of the parameters discussed above before and after the addition of the cap found that $I_c$ dropped by factors of 1.3-3 and $R_n$ increased by factors of 1.1 to 3 as a result of cap addition, suggesting some possible alteration of the grain boundaries properties on the implementation of the cap.

BACKGROUND OF THE INVENTION

An extremely important concern for applications of the recently discovered high temperature superconductors (HTS) has been the development of repeatable, reasonably high quality hysteretic and non-hysteretic Josephson junctions.

Non-hysteretic Josephson junctions have been demonstrated in HTS materials by a variety of microelectronic-compatible techniques. Most of the process development to date for these non-hysteretic Josephson junctions has involved engineering YBaCuO, as grown, grain boundary junctions into circuits located on the substrate in the layout; however, one alternate technique offers HTS junctions with at least a quasi-integratable process. The process involves artificially etching a step-edge into a substrate before YBCO film growth, as set forth in Daly, K. P. et al., Appl. Phys. Lett., Vol. 58, p. 543 (1991). If the step-edge angle is sufficiently steep and the step height to film thickness ratio is reasonable, grain boundary junctions form with good uniformity and yield. Epi-layer induced YBCO junctions are described in Char, K. et al., Appl. Phys. Lett., Vol. 59, p. 733 (1991). While not offering the full spectrum of applications of traditional tunnel junction technology, these devices have many potential uses including SQUIDs, Single Flux Quantum (SFQ) logic, shockwave lines, and long-junction amplifiers.

Early Tl junction attempts relied on finding naturally occurring grain boundaries which is not reasonable for microelectronic applications. Indeed, other TlCaBaCuO junctions have relied on native grain boundaries, see e.g., Miklich, A. H. et al., Appl. Phys. Lett., Vol. 59, p. 742 (1991). These junctions lack the microelectronic-like nature of the inventive technique described herein; they are not as uniform, have a lower yield, and have lower figures of merit.

The grain boundary chemistry is very different in the various HTS materials such as YBaCuO (YBCO), BiSrCaCuO and related compounds (Bi), and TlCaBaCuO (Tl). The grain boundaries in the YBCO system tend to be loosely coupled and normal-conducting in nature. In poorly deposited films, this is the most common cause of poor electrical performance. In the Bi and Tl systems, the grain boundaries tend to be more insulating in nature possibly because the structure causes greater oxygen excesses in the boundaries. The Bi and Tl grain boundaries also tend to be more strongly linked in bulk material and superconducting property degradation in high magnetic is more the result of the material itself, rather than the grain boundaries, as with YBCO.

Because of the insulating nature of the boundaries of Tl materials, they are attractive for high performance junctions where a good insulating barrier is desired. If the grain boundaries can be weakened without destroying their material properties, successful high performance devices are possible. The growth of HTS material on the substrate step may be sufficient to weaken the boundaries and should not alter the fundamental boundary structure significantly.

The following documents are incorporated by reference: Morphology Control and High Critical Currants in Superconducting Thin Films in the Tl-Ca-Ba-Cu-O System, Ginley, D. S., Kwak, J. F., Venturini, E. L., Morosin, B. and Baughman, R. J., Physica C 160, 42 (1989), Fabrication of TlCaBaCuO Step-Edge Josephson Junctions with Hysteretic Behavior, Martens, J. S., Hietala, V. M., Zipperian, T. E., Vawter, G. A., Ginley, D. S., Tigges, C. P., Plut, T. A. and Hohenwarter, G. K. G., Appl. Phys. Lett., Vol 60, No. 8, pp 1013-1015, Feb. 24, 1992, and TlCaBaCuO Step-Edge Josephson Junctions, Martens, J. S., Zipperian, T. E., Vawter, G. A., Ginley, D. S., Hietala, V. M., and Tigges, C. P., Appl. Phys. Lett., Vol 60, No. 9, pp. 1141-1143, Mar. 2, 1992.

For non-hysteretic Josephson junctions, we have invented a step-edge process to produce repeatable, high quality Josephson junctions using the HTS materials of the TlCaBaCuO system. The Tl system is desirable because of its higher $T_c$ (up to 125K) compared to the more common YBa$_2$Cu$_3$O$_7$ system with its lower $T_c$ (92K), and its large value of the product $I_c R_n$ incurred while operating at a temperature of 77K which is indicative of high junction quality. Testing of over 250 junctions produced using the subject process has resulted in a yield of over 70% at temperatures to 100K.

One way to create hysteretic Josephson junctions from available non-hysteretic high temperature superconducting junctions is to artificially add capacitance. Hysteretic HTS junctions open up the possibility for many circuits which operate above a temperature of 77K. Hysteretic junctions are needed for voltage-state latching logic, SIS mixers, and studies of the superconductor gap structure of HTS materials. In addition, the coupling of very fast Josephson junction signals to the nonsuperconducting world becomes simpler with hysteretic junctions.

It is thus an object of the invention to provide a HTS Josephson junction that operates at higher temperatures, is compatible with microelectronic techniques, has a high degree of quality, a high yield and good uniformity.

Another object of the invention is to provide a HTS Josephson junction with hysteretic properties through the addition of an artificial capacitor to the non-hysteretic Josephson junction.

SUMMARY OF THE INVENTION

The foregoing and other problems are overcome and the objects of the invention are realized by a process for formulating a non-hysteretic Josephson junction using HTS materials which results in a junction having the ability to operate at high temperatures while maintaining high uniformity and quality. The Josephson junction is formed by etching a step in a LaAlO3 substrate and then depositing a thin film of TlCaBaCuO on the substrate, covering the step, and forming a grain boundary at the step and a subsequent Josephson junction. Once the non-hysteretic junction is formed, the next step is to add capacitance to the system. In the current embodiment, this is accomplished by adding a thin dielectric layer, LaAlO3, however, any dielectric which is chemically compatible with the superconductor and of low loss and relatively high dielectric constant will work. The implementation of the dielectric layer is followed by a cap layer of a normal metal where the cap layer is formed by first depositing a thin layer of titanium (Ti) followed by a layer of gold (Au). The dielectric layer and the normal metal cap are patterned to the desired geometry.

BRIEF DESCRIPTION OF THE DRAWING

The above set forth and other features of the invention are made more apparent in the ensuing Detailed Description of the Invention when read in conjunction with the attached Drawing), wherein.

DETAILED DESCRIPTION OF THE INVENTION

Figure 1:
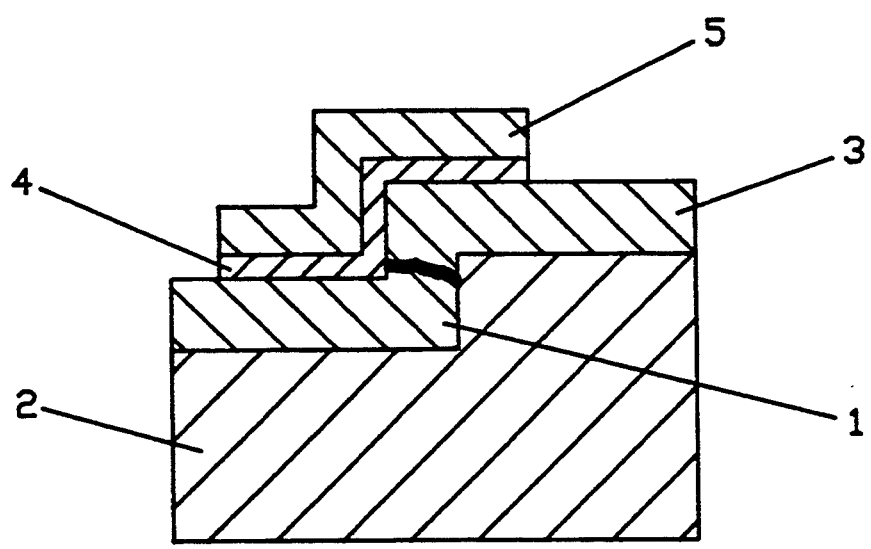
FIG. 1 ia an illustration of the structure of the Tl non-hysteretic Josephson junction.

As shown in FIG. 1, the fundamental non-hysteretic invention is a process for forming a step-edge Josephson junction using HTS, TlCaBaCuO, materials. The step 1 is formed by argon ion milling of a crystal of LaAlO3 to form a step-edge substrate 2. In etching the crystal, a 500 eV Ar+ beam was employed in conjunction with a 0.25 mTorr chamber pressure and with a 70 degree C. sample temperature. Both Ti, Ni and ordinary photoresist masks (not shown) have been used with equivalent results. Step heights of 350 nm were achieved after 20 minutes of etching; however, the step 1 is typically 300 nm in height.

The TlCaBaCuO HTS film 3 was deposited on the crystalline substrate 2 by sequential e-beam evaporation or by sputtering followed by sintering in air, typically for 16 minutes at 850 C., while under a partial pressure of Tl-O, and then annealed in oxygen for about 10 minutes at a temperature of 750 C. This technique generally resulted in a nominal film thickness of between 300 to 400 nm. The film 3 exhibited complete c-axis orientation normal to the crystalline substrate but only partial a-axis orientation in the plane. The grain size of the film was typically over 100 micrometers and the film was generally smooth on a scale <50 nm with the phase being predominantly $Tl_2Ca_2Ba_2Cu_3O_{10}$. Of the various test films deposited on their respective substrates, the critical temperature, $T_c$ was found to be in the range of 103–105K and the film, not the junction, experienced critical current densities of $3 \times 10^5$ to $5 \times 10^5$ A/cm$^2$. Non-hysteretic junctions typically had critical current densities of 1–10 kA/cm$^2$, and for 5 micrometer wide non-hysteretic junctions, the normal state resistance is on the order of 100 ohms. The disruption in film growth caused by the step 1 resulted in the single or multi-phase grain boundary formation in the film 3 at the desired location. Thus, by patterning the substrate 2 with a given circuit in mind, the circuit can be entirely lithographically defined without relying on the random formation of natural grain boundaries where needed.

To formulate the test devices for the subject Josephson junction the following additional steps were employed. Silver contacts (not shown) were e-beam evaporated and annealed at 400 degree C. An interlevel dielectric 4, about 1 micrometer thick, of hard-baked negative photoresist was used to protect the junctions and insulate the HTS level from the top normal metal layer. The top normal metal layer 5, 40 nm of Ti followed by 250 nm of Au, was patterned into control lines to test magnetic field dependence of the critical current and to aid in RF field coupling for Shapiro step observation experiments.

Of the wafers made to date, the critical current densities, $J_c$, ranged from 500 A/cm$^2$ to 25kA/cm$^2$ with close correlation observed between local film thickness and $J_c$. Among a group of 50 functional junctions on one wafer, the average $J_c$ was 5 kA/cm$^2$ with a maximum deviation of 0.74 kA/cm$^2$. Junction widths ranged from 5–50 micrometers with the smallest ones having the lowest yield. The yield on the larger junctions was higher, about 80% on 50 micrometer junctions. These are technically long junctions, and an asymmetric $I_c$ vs. applied magnetic field behavior has been observed.

Figure 2:
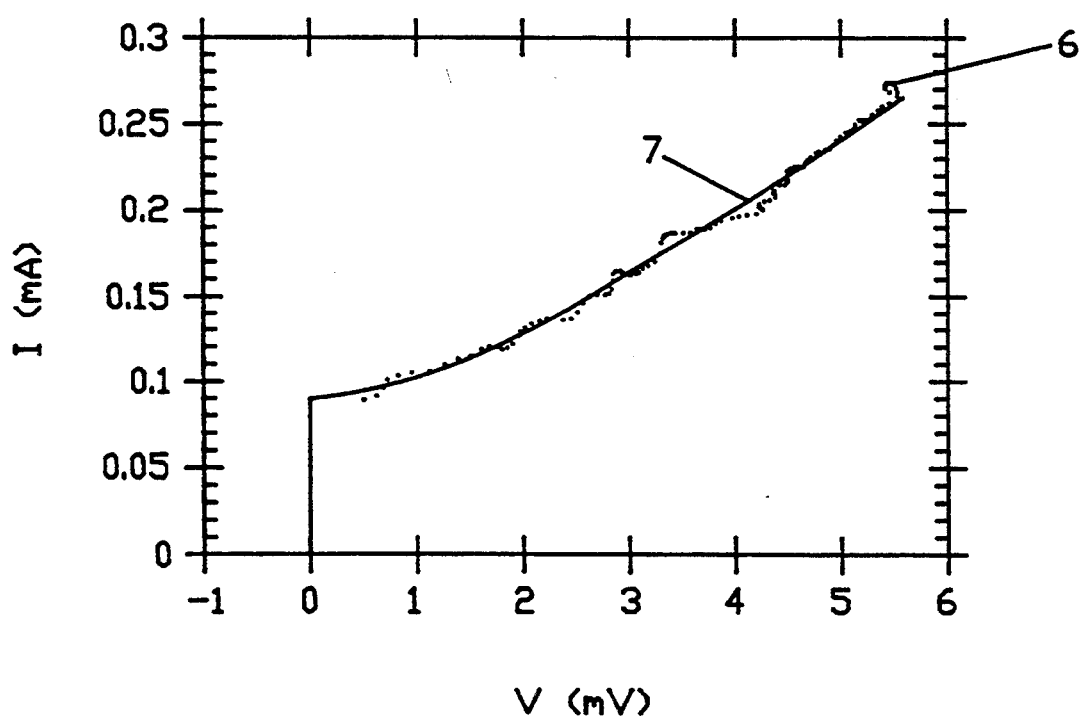
FIG. 2 is a graphic illustration of the voltage versus the current for the Tl non-hysteretic Josephson junction having a width of 10 micrometers and a film thickness of 200 nanometers at an operating temperature of 77K.
Figure 3:
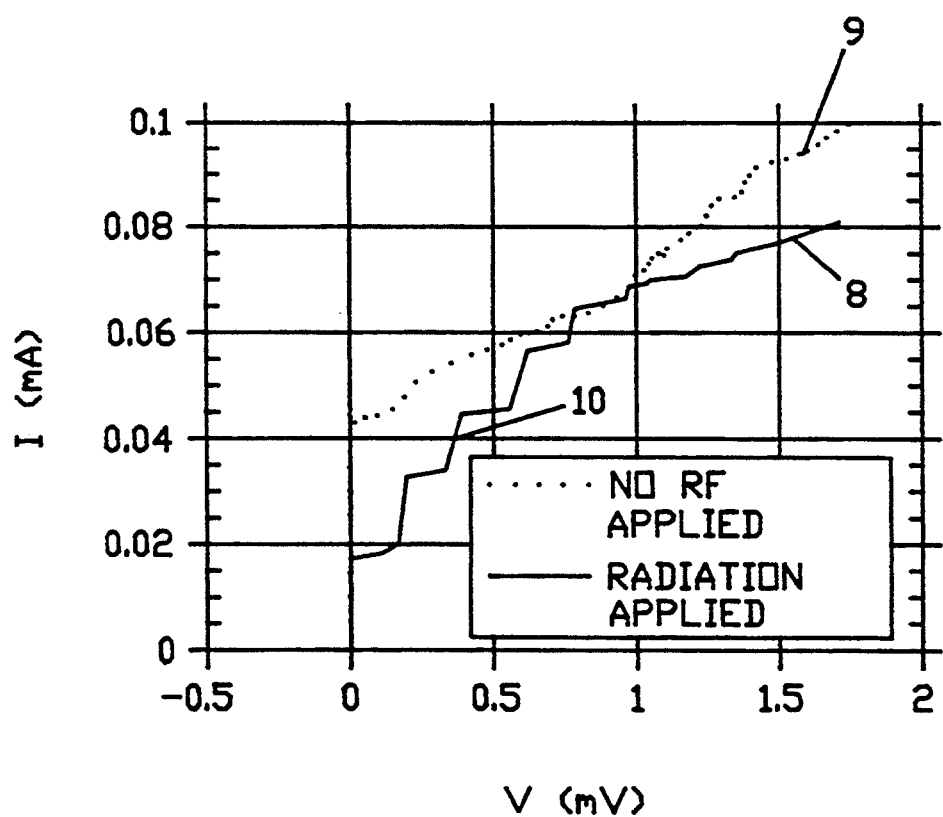
FIG. 3 is a graphic illustration of the voltage versus the current for the Tl non-hysteretic Josephson junction having a width of 10 micrometers and a film thickness of 200 nanometers at an operating temperature of 77K where the graph depicts the data with and without an applied 93.6 GHz electromagnetic field.

A functional junction is defined as having $I_c > 1$ microampere at a temperature of 77K and having the characteristics of a resistively shunted junction model (RSJ). FIG. 2 depicts a typical graphical point plot of the current, I, versus the voltage, V, for a specified film width and thickness 6; a best fit RSJ curve 7 is drawn showing good correlation. FIG. 3 also depicts a current versus voltage plot; however, in this case, the parameters are measured under the added conditions of incident radiation 8 and absent incident radiation 9. Again the RSJ-like shape is present and the Shapiro steps 10 are well defined. The cleanliness of the curve suggests that the junction is not acting as an incoherent array.

Figure 4:
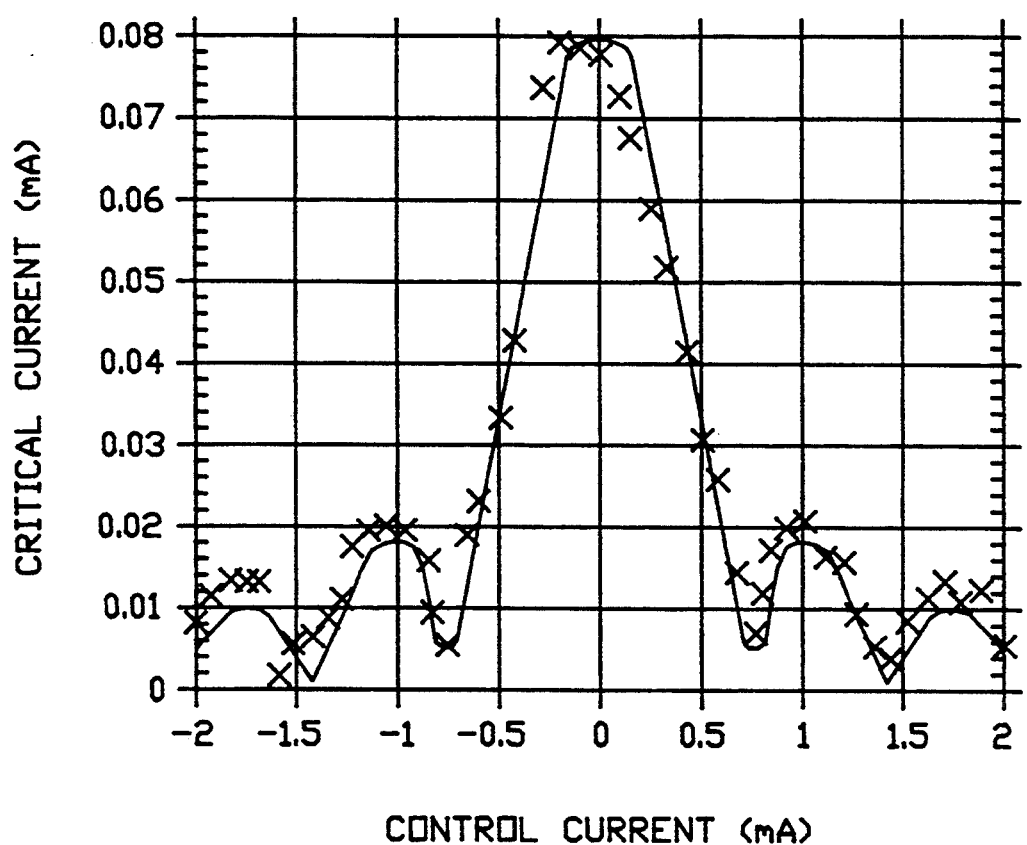
FIG. 4 depicts the critical current dependence, at a temperature of 77K, of a step-edge non-hysteretic Josephson junction having a width of 10 micrometers with a critical current density of about 4000 A/cm$^2$ and under the influence of an applied magnetic field instituted via an external control line.

FIG. 4 illustrates the magnetic field dependence of the junction as it relates to small junction dependence. The quality of the fit suggests that the junction is uniform and the device is strongly dominated by a single junction.

The $I_cR_n$ of all of the tested junctions was high, in excess of any previous results for YBCO, with the average for 50 junctions exceeding 1 mV at a temperature of 77K. The measured values for $I_c$ and $R_n$ did not differ significantly between the junctions tested.

The technological process for developing Tl step-edge non-hysteretic Josephson junctions is capable of producing high quality junctions with relatively high yield and good uniformity within a junction and across the wafer. The multilevel process allows for reasonable circuit complexity such as control lines, wiring etc., without adversely affecting the junction quality.

In order to get strong hysteresis in a Josephson junction, it is necessary to add a few tenths of a picofarad of capacitance to the non-hysteretic junction where the required capacitance is dependent on the normal state resistance and on the critical current of the non-hysteretic junction. The invention produces a hysteretic Josephson junction by adding the capacitance to the HTS step-edge junction described above.

Figure 5:
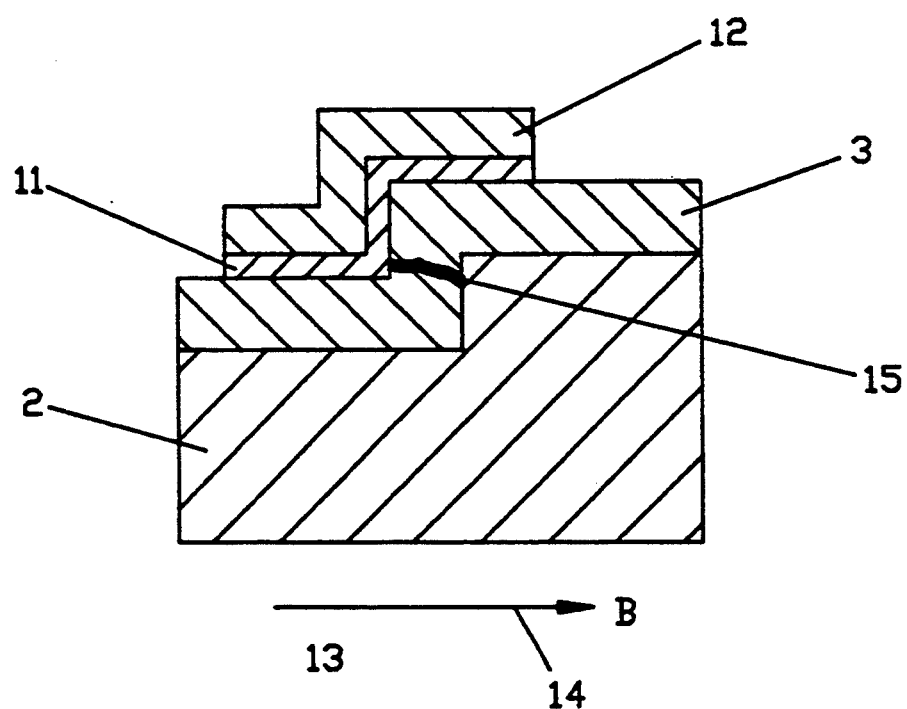
FIG. 5 illustrates the structure of the hysteretic Josephson junction.

FIG. 5 shows the addition of the capacitive elements to the non-hysteretic junction. The structure 13 must be kept as small as possible to avoid adding inductance or resistance which could lead to a large number of resonances. The estimated capacitive addition based on the structure 13 of FIG. 5 is approximately 0.1 to 0.3 picofarads depending on the local roughness of the Tl layer. To provide the additional capacitance, the LaAlO$_3$ layer 11 was RF sputtered, at 100 watts for an unheated substrate, on to the Tl film 3 to a thickness of about 35 nm. The normal metal cap 12 comprises a base layer of approximately 40 nm of Ti followed by a layer of approximately 250 nm of Au. These layers were deposited by electron beam evaporation and lift off. For the data expressed in FIGS. 6–8, the area of the metal cap 12, after standard lithographic definition and scribing, was about 25 square micrometers.

Figure 6:
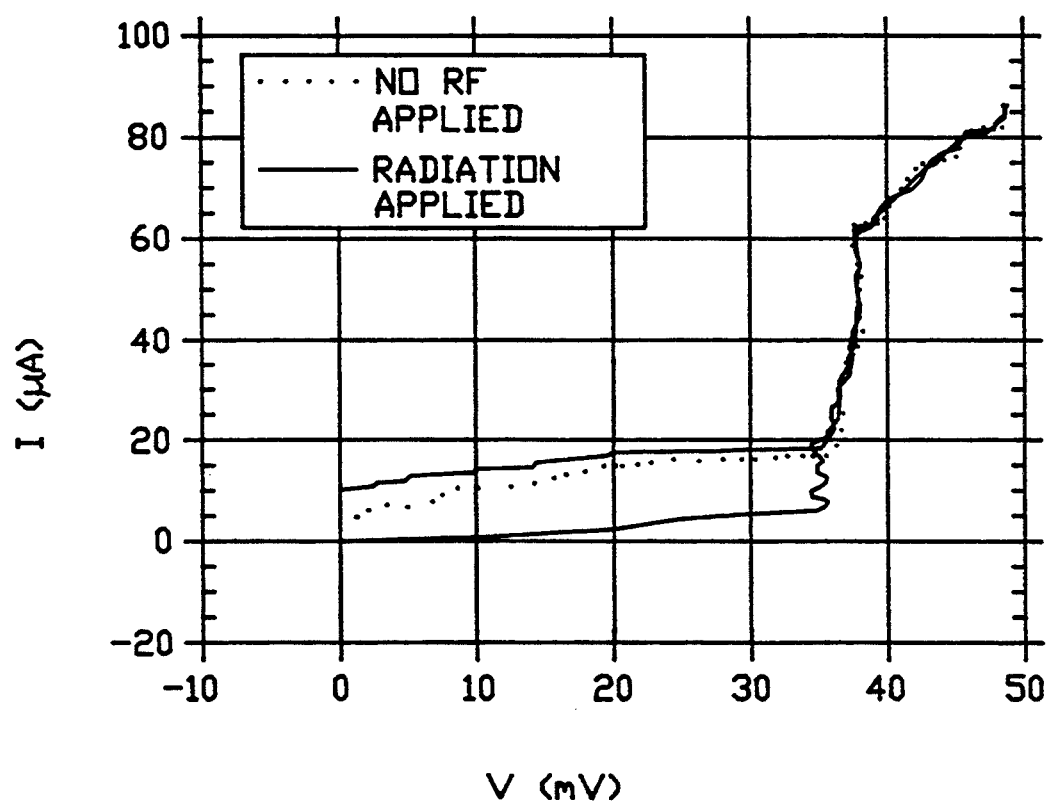
FIG. 6 is a graphical illustration of the current-voltage characteristics for a 5 micrometer wide hysteretic device where one curve represents the device under the influence of an applied magnetic field and the other curve represents the lack of an applied magnetic field.
Figure 7:
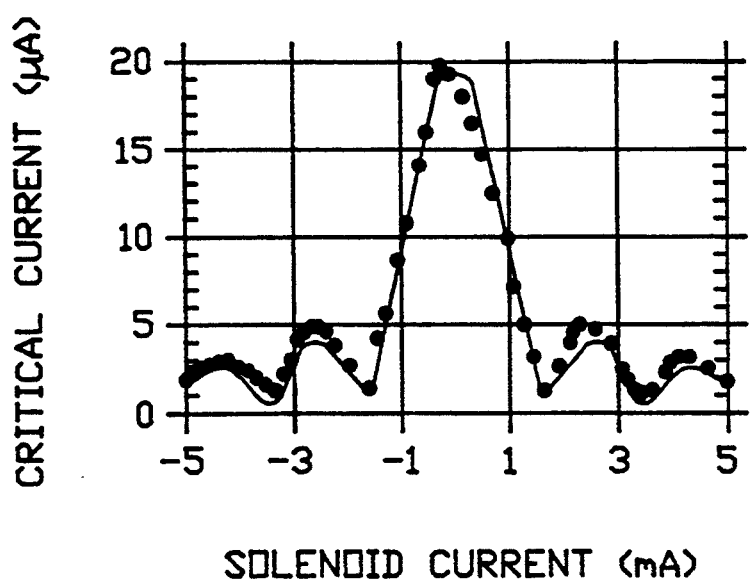
FIG. 7 is a graphical illustration of the dependence of the critical current of a hysteretic Josephson junction on an applied magnetic field induced by a solenoid placed just above the junction where the field strength is represented by the solenoidal current.

The current-voltage (IV) curves of the hysteretic Josephson junction 13 are depicted in FIG. 6. FIG. 6 represents a four-point measurement with the current sweep provided by a semiconductor parameter analyzer (not shown) and the voltage measured by a sensitive amplifier (not shown). As with the non-hysteretic Josephson junction, the hysteretic junction displayed Fraunhofer-like magnetic field dependence for the critical current, FIG. 7. The magnetic field, B, of FIG. 7 was applied in the direction indicated in FIG. 5, 14. The magnetic field dependence displayed little variation, except for scaling, as long as the field remained in the plane of the section of FIG. 5 and passed through the Josephson junction area 16. The estimated current density, $J_c$, of the junction for FIG. 6 is about 1kA/cm$^2$; however, there is some excess current that was not present in the non-hysteretic junctions. Excess current is defined as that remaining when the normal branch of the IV curve, FIG. 6, is extrapolated back to zero voltage.

In some of the test hysteretic Josephson junctions, the excess current grew to 0.25$I_c$. The noise evident in the test parameters was higher than that observed for the non-hysteretic junction; this variation suggests that the additional processing steps employed to form the hysteretic junction may have introduced some inhomogeneities.

The parameter beta, $\beta$, is used to quantify the amount of observed hysteresis. The parameter beta is defined using the minimum value of the ratio $I/I_c$, where I is measured on the hysteretic return path, backwards into the RSJ model. For hysteretic Josephson junctions, $\beta$ will correspond to the standard McCumber $\beta$ as is expressed by $4\pi eI_cCR_n^2/h$ where e is the charge of the electron, h is Plank's constant, C is the effective capacitance and $R_n$ is the normal state resistance. The values of $\beta$ experienced a wide variation which may be due to roughness of the Tl surface which changed the effective added capacitance. The observed values of $\beta$ varied from 5 to greater than 1000 where the greater the value of $\beta$ the more hysteretic the junction.

$I_c$ and $R_n$ measurements were conducted at two points in the process of formulating a hysteretic Josephson junction: at the non-hysteretic Josephson junction stage and at the hysteretic Josephson junction stage when the additive capacitance was added to the non-hysteretic junction. The results showed a drop in the measured value of $I_c$ by a factor of 1.3 to 3 and a drop in the $R_n$ by a factor of from 1.1 to 3. These changes suggested that the addition of the capacitive cap produced an interference with the grain boundaries. One possible reason for the disruption of the grain boundary is the bombardment of the non-hysteretic junction by energetic oxygen ions during the RF sputter deposition of the LaAlO$_3$.

Figure 8:
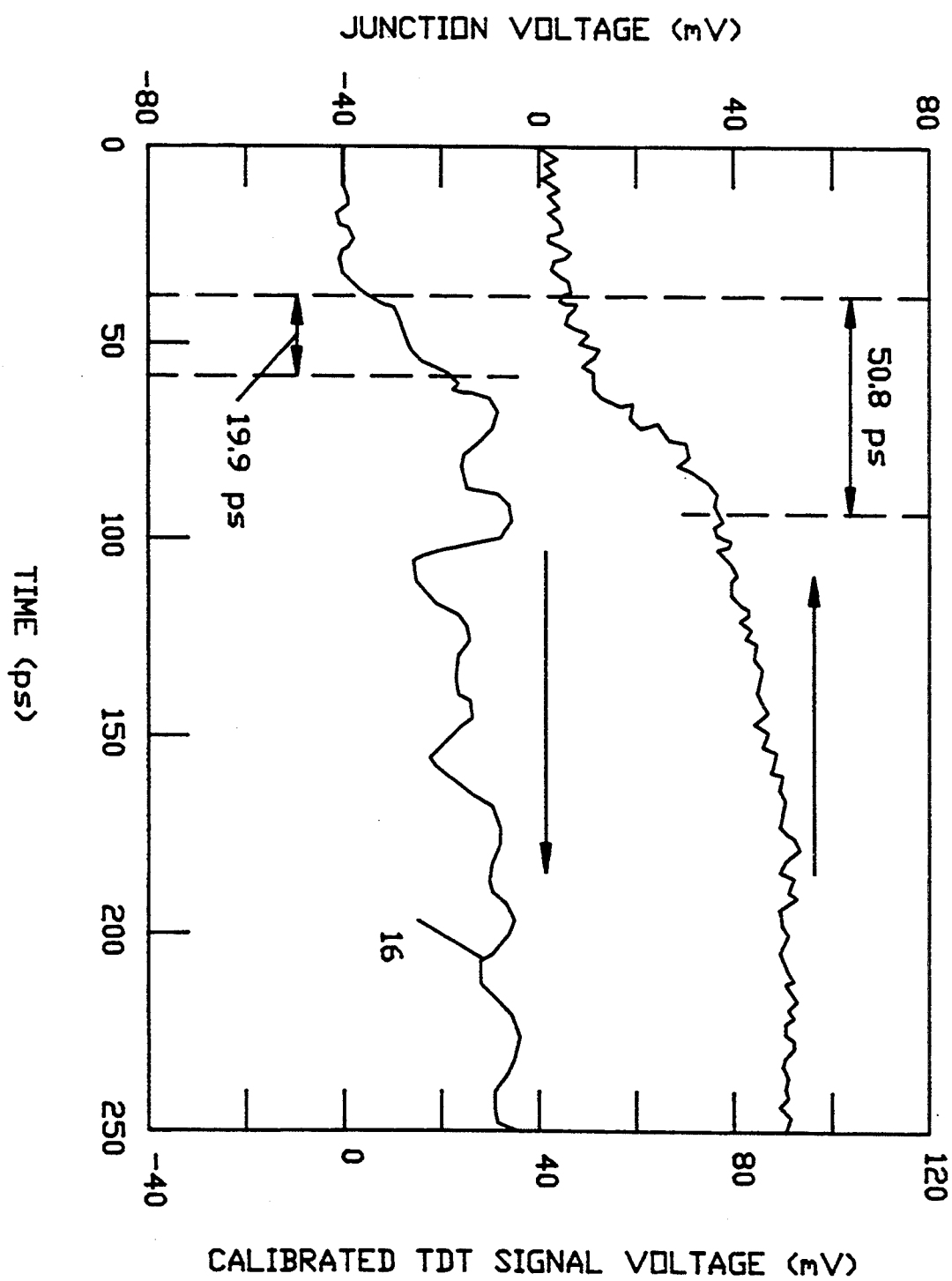
FIG. 8 is graphical illustration of the transient response of one of the hysteretic junctions to an increase in the current above $I_c$ where the junction current was bias ramped while the junction voltage was monitored on a sampling scope. The fixture limited switching time (upper trace) was about 50 picoseconds while for a calibrated signal path (lower trace) the rise time is less than 20 picoseconds.

The switching speed of the hysteretic Josephson junction was also examined. FIG. 8 is a graphical plot of the hysteretic junction voltage response to a slow increase in bias current. A rise time to the first plateau of approximately 50 picoseconds was observed. To get a better estimate of the switching speed, calibrated time domain transmission (TDT) measurements were made using an adjacent control line (not shown). The junction was biased just below $I_c$ and the TDT step signal was applied to the control line. The TDT step signal suppresses $I_c$ to switch the junction into the voltage state depicted in the lower trace 16, FIG. 8. The junction switch time, under these conditions was measured at less than 20 picoseconds.

Thus, while the invention has been particularly shown and described with respect to exemplary embodiments thereof, it will be understood by those skilled in the art that changes in form and details may be made therein without departing from the scope and spirit of the invention.

What is claimed is:

1. A hysteretic Josephson junction comprising:
   (a) a crystalline substrate having a step etched into said substrate;
   (b) a film of TlCaBaCuO, a high temperature superconductor, deposited on said crystalline substrate where said Tl film overlays said step, thus, creating a grain boundary at said step with the resultant formation of a non-hysteric Josephson junction;
   (c) a thin dielectric layer overlaying the region of said Tl film containing the grain boundary;
   (d) a metal cap wherein said metal cap overlays said dielectric over the region in the Tl film containing the grain boundary creating a capacitor when said cap is electrically coupled to said Tl film and where the added capacitance coupled with said non-hysteretic Josephson junction forms a hysteretic Josephson junction.

2. The junction of claim 1 where said crystalline substrate is $LaAlO_3$.

3. The junction of claim 1 where said dielectric is $LaAlO_3$.

4. The junction of claim 1 where said metal cap is a normal metal cap.

5. The junction of claim 4 where said normal metal cap is formed from a layer of Ti positioned next to said dielectric layer to form a base layer and where said base layer is then covered by a layer of Au.

* * * * *